United States Patent
Kulinsky

(12) 
(10) Patent No.: US 6,621,166 B2
(45) Date of Patent: Sep. 16, 2003

(54) FIVE LAYER ADHESIVE/INSULATOR/METAL/INSULATOR/ADHESIVE TAPE FOR SEMICONDUCTOR DIE PACKAGING

(75) Inventor: Lawrence Kulinsky, Los Angeles, CA (US)

(73) Assignee: International Rectifier Corporation, El Segundo, CA (US)

( * ) Notice: Subject to any disclaimer, the term of this patent is extended or adjusted under 35 U.S.C. 154(b) by 36 days.

(21) Appl. No.: 09/860,304

(22) Filed: May 18, 2001

(65) Prior Publication Data

US 2001/0042592 A1 Nov. 22, 2001

Related U.S. Application Data

(60) Provisional application No. 60/205,726, filed on May 19, 2000.

(51) Int. Cl.[7] ............................................... H01L 23/48
(52) U.S. Cl. .................. 257/750; 257/666; 257/668; 257/670; 257/780; 257/669; 257/671; 257/680; 257/700; 257/783
(58) Field of Search ................................. 257/666, 668, 257/670, 780, 669, 671, 680, 700, 750, 783; 428/343, 344

(56) References Cited

U.S. PATENT DOCUMENTS

| | | | | |
|---|---|---|---|---|
| 5,073,521 A | * | 12/1991 | Braden | 29/827 |
| 5,227,232 A | * | 7/1993 | Lim | 428/344 |
| 5,546,655 A | * | 8/1996 | Feger et al. | 29/846 |
| 5,589,668 A | * | 12/1996 | Yamaguchi et al. | 174/266 |
| 6,046,495 A | * | 4/2000 | Urushima | 257/668 |
| 6,235,385 B1 | * | 5/2001 | Lee | 428/344 |

* cited by examiner

*Primary Examiner*—Michael S. Lebentritt
*Assistant Examiner*—Douglas Menz
(74) *Attorney, Agent, or Firm*—Ostrolenk, Faber, Gerb & Soffen, LLP

(57) ABSTRACT

A novel five-layer tape is provided for applications such as bonding, interconnection and insulation of different parts of a semiconductor package at the same time. The five layer tape includes a metal conductive layer that is sandwiched between two insulative layers, that are themselves in turn sandwiched by two adhesive layers. Windows cut into the insulative and adhesive layers on either the top or bottom of the tape permit electrical connection to the metallic conductive layer. The tape may be made from two insulation sheets that have an adhesive layer and a metallic interconnect. In turn, the tape enables the manufacturer to overcome physical limitations in forming conduction paths, including permitting the connection of multiple die where the terminals of the one die are obscured by the other die.

7 Claims, 4 Drawing Sheets

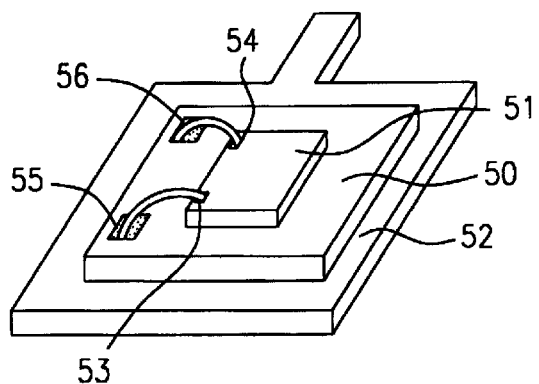
(PRIOR ART)
*FIG. 4*
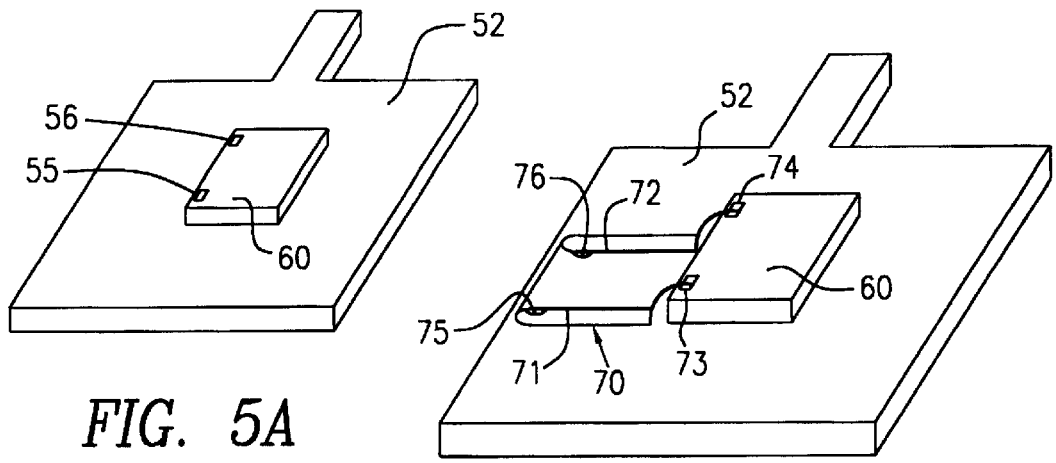
*FIG. 5A*
*FIG. 5B*
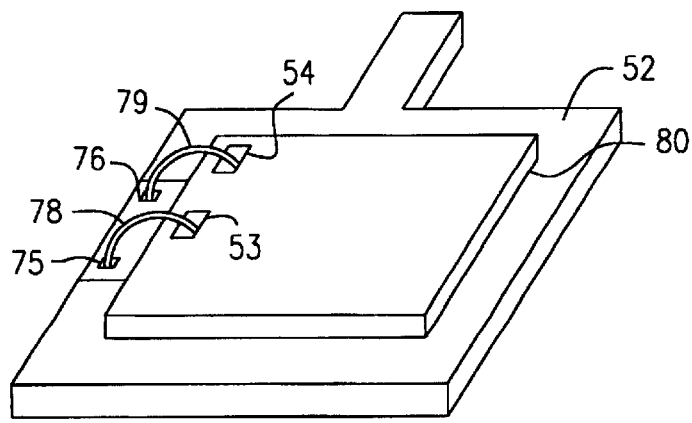
*FIG. 5C*

FIVE LAYER ADHESIVE/INSULATOR/ METAL/INSULATOR/ADHESIVE TAPE FOR SEMICONDUCTOR DIE PACKAGING

RELATED APPLICATION

This application is related to and claims priority from Provisional Application Ser. No. 60/205,726, filed May 19, 2000.

FIELD OF THE INVENTION

This invention relates to semiconductor die packaging and more specifically relates to a novel five-layer tape which enables the mounting and interconnection of plural semiconductor die relative to one another and to a lead frame support.

BACKGROUND OF THE INVENTION

Metallization-on-tape is a type of an interconnect that is routinely used in the semiconductor industry in various applications such as tape-automated bonding (TAB). The use of polymer film for this purpose, such as polyimide as an insulative layer, is also known and is used in many semiconductor packaging solutions. Placing an adhesive layer on the film is also used to bond interconnects or insulation layers to the substrate and/or semiconductor die.

However, all three elements—adhesive layers, insulative layers (such as polyimide film) and metallic fingers/interconnect have not been previously combined in a single tape.

BRIEF DESCRIPTION OF THE INVENTION

In accordance with the invention, a novel five-layer sandwich of adhesive, insulation, metal, insulation and adhesive layers provides a whole new variety of potential applications such as bonding, interconnection and mutual insulation of different parts of the semiconductor package at the same time. In order to have a contact with a terminal on the semiconductor die or other bonding pad site, windows are formed in the insulative layer. Then thermocompression, for example, can be used to as a means to connect the metallic layer of the tape to the bonding site by conventional means. The novel tape can be produced, using a double-side adhesive insulative tape (for example, a polyimide film coated with adhesive) with windows formed in the film at designated sites where connection is to take place. A metallic layer is deposited/pressed down/glued onto the insulation layer as desired. Finally a single-sided or double-sided adhesive-coated insulated layer (also with precut windows if desired) is pressed on top of the metallic layer and the first insulative layer to produce the finished tape. The tape may be unreeled from a supply reel of any desired length, and then cut off in pieces of size suitable for a given application.

BRIEF DESCRIPTION OF THE DRAWINGS

FIG. 4 shows a prior art die-on-die and a wire-bonded semiconductor package.

FIGS. 5A, 5B and 5C show the steps in forming a novel die-on-die package using the novel tape of the invention.

DETAILED DESCRIPTION OF THE DRAWINGS

Figure 1:
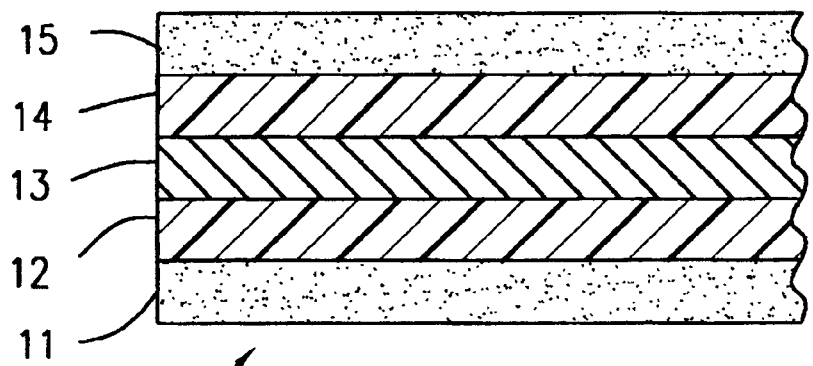
FIG. 1 is a cross-section of the novel 5 layer tape of the invention.

FIG. 1 is a sectional view of the novel five layer tape of the invention. Thus, tape 10 consists of a first layer 11 of adhesive; a second layer 12 of an insulation material, for example, Kapton; a third layer 13 of metal, for example, copper or a copper alloy; a fourth layer 14 which is an insulator layer and may be identical in structure to layer 12 and a fifth layer 15 of adhesive that may be identical to layer 11.

The layer thicknesses are sufficiently thin to enable flexing of the tape body 10, for example, to be rolled into and form a reel and to allow for easy cutting to size by conventional shearing mechanisms used in TAB and other existing processes. Further, the material 10 may have any desired length and width.

Figure 2:
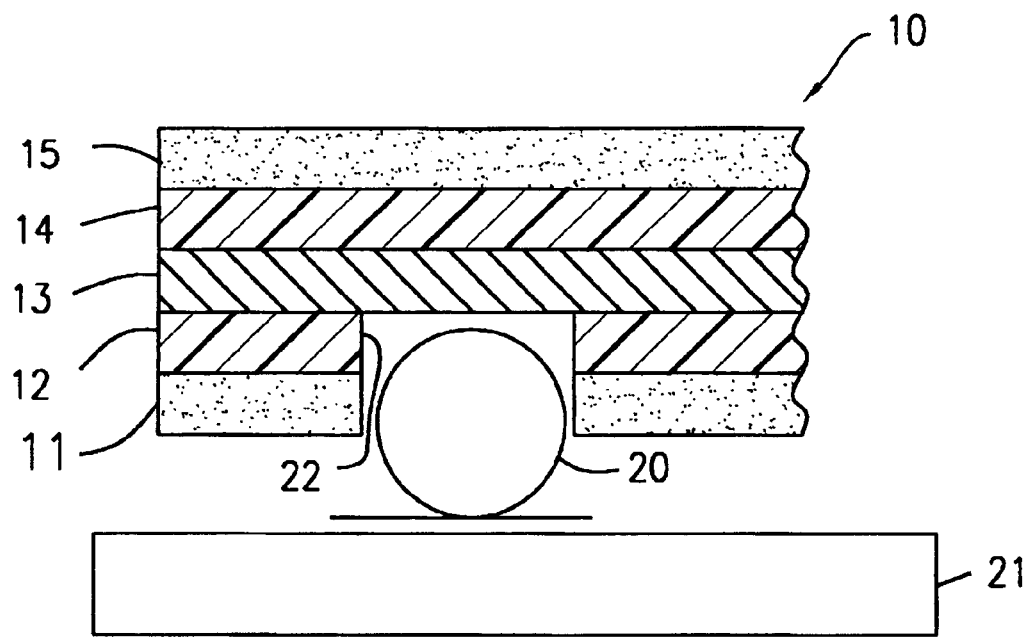
FIG. 2 shows in cross-section, the formation of a window in the tape to permit connection to a semiconductor die electrode gold bump.

The central conductive layer 13 may have the full area of the other layers, or can be formed as one or more traces of predetermined length and pattern. In order to connect layer 13 to a semiconductor die terminal or some other bonding pad site, windows are formed in the insulation layers 12 and 14, and adhesive layers 11 and 15 as desired. A thermocompression bonding site may exist at the exposed area of metal layer 13. Thus as shown in FIG. 2, a connection is made to a gold terminal bump 20 on silicon die 21. To affect this connection, a window 22 is cut into layers 11 and 12 so that, with compression, the top of bump 20 will engage and electrically contact the exposed bottom surface of metal layer 13. The assembly 10 is pressed down forcefully to cause adhesive layer 11 to engage and adhere to the top surface of die 21, holding the bump 20 and metal layer 13 in good low resistance contact.

Obviously, plural windows placed in different areas of the body 10 and on opposite surfaces thereof to metal 13 will enable the interconnection of a plurality of terminals of the die 21 and of other die (not shown) and of the die support structure.

Figure 3:
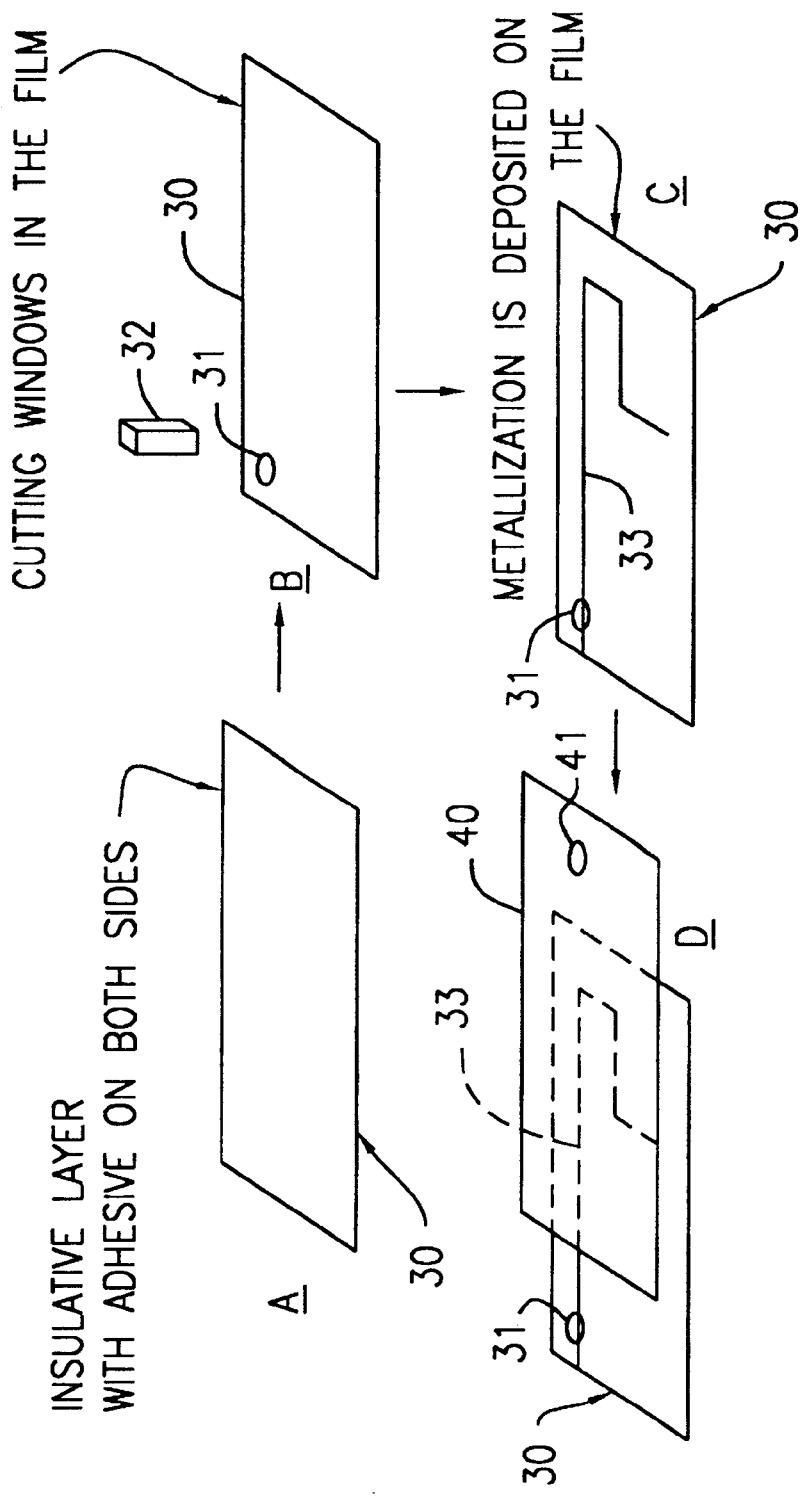
FIG. 3 shows the steps which can be used to bury and form terminals for a conductive trace in the novel five layer film.

FIG. 3 shows, in steps A, B, C and D one method for making the body or tape 10. Thus FIG. 3A shows the starting body 30 which is a thin insulation sheet, for example, any desired polyimide having adhesive layers coated on both of its surfaces. Windows 31, shown in FIG. 3B are then cut, for example, by a stamping die tool 32 in sheet 30. Any desired number of windows can be formed, depending on the end application or package.

A metal interconnect layer or trace 33, shown in FIG. 3C is then formed atop the adhesive surface of sheet 30, overlapping window 31. Layer 33 may have any desired configuration, shown as a convoluted trace in FIGS. 3C and 3D and may be a foil pressed onto the adhesive surface of layer 30; or may be otherwise formed or deposited.

Next, and as shown in FIG. 3D, a sheet 40, which may have adhesive on its lower surface and preferably on both of its surfaces, is pressed on top of and adheres to sheet 30 and metal interconnect 33. Sheet 40 may also have windows, such as window 41 which, in the final assembly, will overlay metal trace 33 to make possible a connection of one terminal at window 31 to a second terminal at window 41.

FIG. 4 shows a prior art die-on-die bonded package that can be improved by the tape of the present invention.

Die-on-die bonding is a known way to arrange several die in a co-pack type device. This bonding technique has several advantages over the conventional side-by-side bonding including higher device density, lower isolation requirements and the potential for a smaller resulting device size. A typical co-pack, shown in FIG. 4, includes two die-one power transistor die 50 (such as MOSFET), and an IC controller die 51. Die 50 is mounted with its drain contact metal on the conductive paddle 52 of a lead frame. The IC die 51 is then mounted on the top surface of die 50. Wire bonds from the output terminals 53 and 54 of the IC die 51 are connected to the exposed gate and source terminals 55 and 56 of power MOSFET 50 (the drain of which is connected to flag 52).

The die-on-die solution of FIG. 4 can be used only if IC controller die 51 is much smaller than the MOSFET die 50; then IC 51 is bonded on top of the MOSFET 50 and selected terminals of the MOSFET 50 can be wired to selected terminals of the IC controller by conventional wire-bonding methods. If the IC controller die 51 is as large as or larger than die MOSFET 50, the described solution is not feasible, since the MOSFET contacts 55, 56 would be underneath the IC 51 and wire bonding can not take place.

With the novel tape 10 of the invention, the device of FIG. 4 can be housed in a die-on-die configuration even though IC die 51 is larger in area than MOSFET die 50. Thus, it becomes possible, with the invention, to, in effect, move the MOSFET bonding pads outside the outline of die 50 and on to the flag 52. This structure is best shown in FIGS. 5A, 5B and 5C in which parts similar to these of the preceding Figures have the same numerals.

Thus, in FIG. 5A a MOSFET die 60, of smaller area than that of IC die 51 of FIG. 4, has its bottom drain contact soldered or otherwise connected to flag or paddle 52 of the device lead frame. An elongated tape 70 of the structure previously described above, has two elongated buried metal strips 71 and 72 which extend from respective windows 73 and 74 (on the bottom of tape 70 to windows 75 and 76 on the top of the tape as shown in FIG. 5B. An enlarged IC die or chip 80, shown in FIG. 5C is then adhered to the top of die 60 in FIG. 5B, obscuring the die 60 and its gate and source terminals. These terminals however are accessible through tape windows 75 and 76, and conduction strips 71 and 72. Thus, wire bonds 78 and 79 can make connection from the IC output terminals 53 and 54 to the masked MOSFET source and gate terminals that are located under the IC die 80.

Obviously, the concept of moving terminals laterally from die to mounting structure has many applications other than that of FIG. 5C.

Figure 6A:
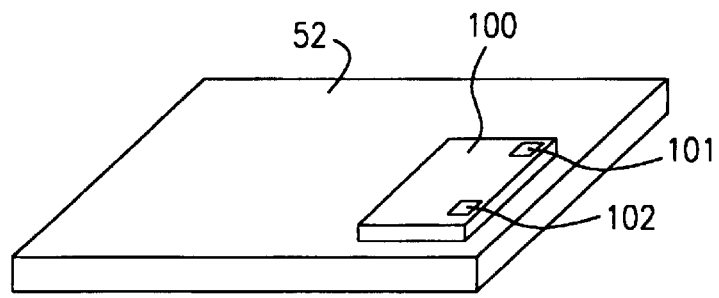
FIGS. 6A, 6B and 6C show the steps in forming a side-by-side die arrangement which can be used, for example, for a half-wave bridge circuit configuration.
Figure 6B:
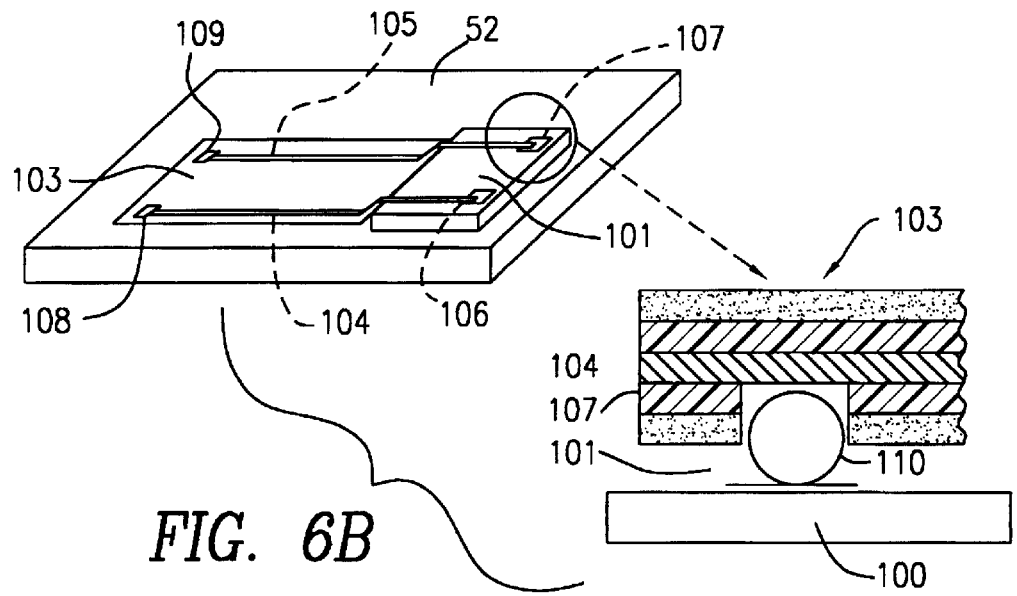
Figure 6C:
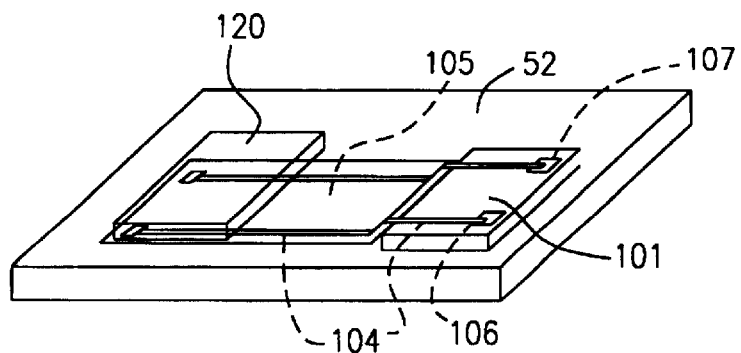

FIGS. 6A, 6B and 6C show the steps for using the novel 5 layer tape of the invention for supporting two die from a common conductive substrate and connecting their terminals to define a bridge circuit. In this circuit, the drain of one device is connected to the conductive substrate while the drain of the other is insulated from the substrate. Such devices have been copacked, but structures such as split lead frames have been needed. The present invention makes it possible to use a common lead frame paddle, using a single strip of tape.

Thus, FIG. 6A shows flag 52 which receives the bottom drain contact of a first MOSFET 100 having source and drain bump contact terminals 101 and 102 respectively. A single sheet 103 of the novel five layer material is prepared with embedded conductor strips 104 and 105, windows 106 and 107 in its bottom layers and windows 108 and 109 in the top layers at the other end of the strip. The strip is pressed into adhesive contact with the top of die 100 and the top of flag 52 and ball contacts (such as ball 110 in the FIG. 6B inset) are pressed into contact with the conductive strips 104 and 105.

As next shown in FIG. 6C, a second MOSFET die 120 is placed atop the sheet 52 and is pressed down to contact the tops of one or both conduction 104, 105, through windows 108 and 109 to connect the source of die 100 to the drain of die 120. Separate connectors or bonds can be made to the gates of die 101 and 120.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A multiple layer tape comprising:

a first insulating layer comprised of a first insulation material disposed on top of a first adhesive layer;

a conductive layer of metal disposed on top of the first insulation layer;

a second insulating layer of a second insulation material disposed on top of the conductive layer;

a second adhesive layer of a second adhesive material, disposed on top of the second insulating layer; and, at least one window cut into one of the adhesive layers and the insulative layer adjacent thereto to expose the metal layer for electrical connection.

2. The tape of claim 1, where the first adhesive material and the second adhesive material are of the same material, so that the first adhesive layer and the second adhesive layer are made of the same material.

3. The tape of claim 1, where the first insulation material and the second insulation material are of the same material, so that the first insulating layer and the second insulating layer are made of the same material.

4. The tape of claim 1, where the first insulating material is Kapton.

5. The tape of claim 1, where each layer is sufficiently thin to enable the tape to be rolled into a roll and to be cut by conventional shearing mechanisms.

6. The tape of claim 1, where the areas of each of the layers are coextensive.

7. The tape of claim 1, where the metal third layer comprises at least one metal trace of predetermined length and pattern.

* * * * *